United States Patent
Lee et al.

(10) Patent No.: US 9,437,141 B2
(45) Date of Patent: Sep. 6, 2016

(54) SCAN DRIVER, LIGHT EMITTING DRIVER, AND DRIVING METHOD THEREOF

(75) Inventors: Wang-Jo Lee, Yongin (KR); Hyung-Soo Kim, Yongin (KR); In-Ho Choi, Yongin (KR); Choon-Yul Oh, Yongin (KR); Ho-Ryun Chung, Yongin (KR); Joo-Hyeon Jeong, Yongin (KR); Myoung-Hwan Yoo, Yongin (KR); Jin-Woo Kim, Yongin (KR); Naoaki Komiya, Yongin (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 1383 days.

(21) Appl. No.: 13/191,646

(22) Filed: Jul. 27, 2011

(65) Prior Publication Data

US 2012/0050251 A1    Mar. 1, 2012

(30) Foreign Application Priority Data

Aug. 25, 2010 (KR) .................. 10-2010-0082515

(51) Int. Cl.
| G09G 5/00 | (2006.01) |
|---|---|
| G05F 1/00 | (2006.01) |
| G09G 3/32 | (2016.01) |
| G11C 19/18 | (2006.01) |
| G11C 19/28 | (2006.01) |

(52) U.S. Cl.
CPC ........... *G09G 3/3291* (2013.01); *G11C 19/184* (2013.01); *G11C 19/28* (2013.01); *G09G 2310/0286* (2013.01)

(58) Field of Classification Search
USPC .......................................... 345/212, 204, 178
See application file for complete search history.

(56) References Cited

U.S. PATENT DOCUMENTS

| 2006/0221041 A1* | 10/2006 | Cho et al. ..................... 345/100 |
|---|---|---|
| 2011/0007040 A1* | 1/2011 | John et al. ..................... 345/204 |
| 2012/0075259 A1* | 3/2012 | Chung .......................... 345/204 |

FOREIGN PATENT DOCUMENTS

| JP | 2003-44004 A | 2/2003 |
|---|---|---|
| KR | 10-2008-0030212 | 4/2008 |
| KR | 10-0830296 | 5/2008 |
| KR | 10-2008-0114365 | 12/2008 |
| WO | 2009130989 A1 | 10/2009 |

* cited by examiner

*Primary Examiner* — William Boddie
*Assistant Examiner* — Alecia D English
(74) *Attorney, Agent, or Firm* — Robert E. Bushnell, Esq.

(57) ABSTRACT

A scan driver includes: a plurality of scan driving blocks including an output terminal outputting a scan signal to a scan line; a first transistor transmitting a voltage of a power source to the output terminal; a second transistor transmitting a clock signal to the output terminal; and a third transistor including a gate electrode connected to a node formed with a gate-on voltage turning on the second transistor, one terminal connected to the power source, and the other terminal connected to the gate electrode of the first transistor. The scan driver may reduce the influence of a leakage current even though application of the scan signal is increased, and a scan signal of a uniform voltage level may be output.

15 Claims, 8 Drawing Sheets

SCAN DRIVER, LIGHT EMITTING DRIVER, AND DRIVING METHOD THEREOF

CLAIM OF PRIORITY

This application makes reference to, incorporates the same herein, and claims all benefits accruing under 35 U.S.C. §119 from an application earlier filed in the Korean Intellectual Property Office on Aug. 25, 2010 and there duly assigned Serial No. 10-2010-0082515.

BACKGROUND OF THE INVENTION

1. Field of the Invention

The present invention relates a scan driver, a light emitting driver, and a driving method thereof. More particularly, the present invention relates to a scan driver, a light emitting driver, and a driving method thereof that are capable of minimizing an influence of a leakage current.

2. Description of the Related Art

Currently, various flat panel displays that can reduce the weight and volume that are drawbacks of the cathode ray tube have been developed. Flat panel displays include a liquid crystal display (LCD), a field emission display, a plasma display panel (PDP), and an organic light emitting diode (OLED) display.

The flat panel display includes a display panel consisting of a plurality of pixels arranged in a matrix format. The display panel includes a plurality of scan lines in a row direction and a plurality of data lines in a column direction, and the plurality of scan lines and the plurality of data lines intersect. The plurality of pixels are driven by scan signals and data signals transmitted through the corresponding scan lines and data lines.

The flat panel display is classified into a passive matrix light emitting display device and an active matrix light emitting display device according to a driving method thereof. Among them, the active matrix type that selectively turns on/off the pixels is mainly used in terms of resolution, contrast, and operation speed.

One pixel of the active matrix organic light emitting diode (OLED) display includes an organic light emitting diode OLED, a driving transistor controlling a current amount supplied to the organic light emitting diode OLED, and a switching transistor transmitting a data signal controlling a light emitting amount of the organic light emitting diode OLED to the driving transistor.

For the light emitting of the organic light emitting diode OLED, the driving transistor must be continuously maintained in a turned-on state. Also, the resistance of the organic light emitting diode OLED may be increased by deterioration. In the case of a panel of a large size, a characteristic deviation between the driving transistors is generated, and the resistance increase by the deterioration of the organic light emitting diode OLED and a moiré pattern due to the characteristic deviation between the driving transistors may be generated. The characteristic deviation of the driving transistor means a deviation of the threshold voltage and mobility between the plurality of driving transistors forming the panel of a large size. Even though the same data voltage is transmitted to the gate electrode of the driving transistor, currents that flow through the driving transistor are different according to the characteristic deviation between a plurality of driving transistors.

To compensate the characteristic deviation between the driving transistors and the resistance deviation by the deterioration of the organic light emitting diode OLED, a determined data signal is periodically or intentionally applied to the pixel and the pixel current of each is measured. Here, the application time of a scan signal applying the data signal to the pixel and a light emitting signal light emitting the pixel is increased. If the application time of the scan signal and the light emitting signal is increased, the scan driver and the light emitting driver may be affected by the leakage current. Accordingly, the voltage of the scan signal and the light emitting signal may not be normally output, and the characteristic deviation between the driving transistors and the resistance deviation due to the deterioration of the organic light emitting diode OLED may not be normally compensated.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention provides a scan driver, a light emitting driver, and a driving method thereof that are capable of reducing a leakage current.

A scan driver according to an exemplary embodiment of the present invention includes: a plurality of scan driving blocks including an output terminal outputting a scan signal to a scan line; a first transistor transmitting a voltage of a power source to the output terminal; a second transistor transmitting a clock signal to the output terminal; and a third transistor including a gate electrode connected to a node formed with a gate-on voltage turning on the second transistor, one terminal connected to the power source, and the other terminal connected to the gate electrode of the first transistor.

When the second transistor is turned on such the clock signal is transmitted to the output terminal, the third transistor may be turned on such that the power source voltage may be transmitted to the gate electrode of the first transistor to turn off the first transistor.

The power source may be a power source of a logic high level, and the first transistor may be a p-channel field effect transistor.

The second transistor and the third transistor may be p-channel field effect transistors.

The clock signal may be transmitted to the output terminal as the voltage of the logic low level.

The plurality of scan driving blocks may be sequentially arranged, and the node may be connected to the sequence input terminal applied with the output signal of the previous arranged scan driving block or the scan start signal.

The second transistor may include the gate electrode connected to the node, one terminal connected to the input terminal for the clock signal, and the other terminal connected to the output terminal.

A capacitor including one terminal connected to the node and the other terminal connected to the other terminal of the second transistor may be further included.

The capacitor may be charged by the output signal of the previous arranged scan driving block or the scan start signal, and the second transistor and the third transistor may be turned on by the voltage charged to the capacitor.

A light emitting driver according to another exemplary embodiment of the present invention includes: a first input block outputting a first sequence signal; a second input block outputting a second sequence signal; and an output block receiving the first sequence signal and the second sequence signal to output a light emitting signal. At least one of the first input block and the second input block includes: an output terminal transmitting one of the first sequence signal and the second sequence signal to the output block; a first transistor transmitting a voltage of a power source to the output terminal; a second transistor transmitting a clock signal to the output terminal; and a third transistor including a gate electrode connected to the first node formed with the gate-on voltage turning on the second transistor, one terminal connected to the power source, and the other terminal connected to the gate electrode of the first transistor.

When the second transistor is turned on such the clock signal is transmitted to the output terminal, the third transistor may be turned on such that the power source voltage is transmitted to the gate electrode of the first transistor to turn off the first transistor.

The power source may be a power source of a logic high level, and the first transistor is a p-channel field effect transistor.

The second transistor and the third transistor may be p-channel field effect transistors.

The clock signal may be transmitted to the output terminal as the voltage of a logic low level.

The second transistor may include the gate electrode connected to the node, one terminal connected to the input terminal of the clock signal, and the other terminal connected to the output terminal.

A capacitor including one terminal connected to the node and the other terminal connected to the other terminal of the second transistor may be further included.

The capacitor may be charged by the output signal of the previous arranged scan driving block or the scan start signal, and the second transistor and the third transistor may be turned on by the voltage charged to the capacitor.

A driving method of a scan driver including a plurality of scan driving block according to another exemplary embodiment of the present invention includes: charging a capacitor by receiving a scan start signal of an output signal of a previous arranged scan driving block; turning on a first transistor transmitting a clock signal to the output terminal through the voltage charged to the capacitor to transmit the clock signal to the output terminal; and turning on the second transistor through the voltage charged to the capacitor to apply the power source voltage to the gate electrode of the third transistor transmitting a power source voltage to the output terminal to turn off the third transistor.

The power source voltage may be a voltage of a logic high level, and the third transistor may be a p-channel field effect transistor.

The first transistor and the second transistor may be p-channel field effect transistors.

The clock signal may be transmitted to the output terminal as the voltage of the logic low level.

The scan driver according to the present invention may reduce the influence of the leakage current even though the application of the scan signal is increased, and the scan signal of the uniform voltage level may be output. The light emitting driver according to the present invention may reduce the influence of the leakage current even though the application of the light emitting signal is increased.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE EMBODIMENTS

Figure 1:
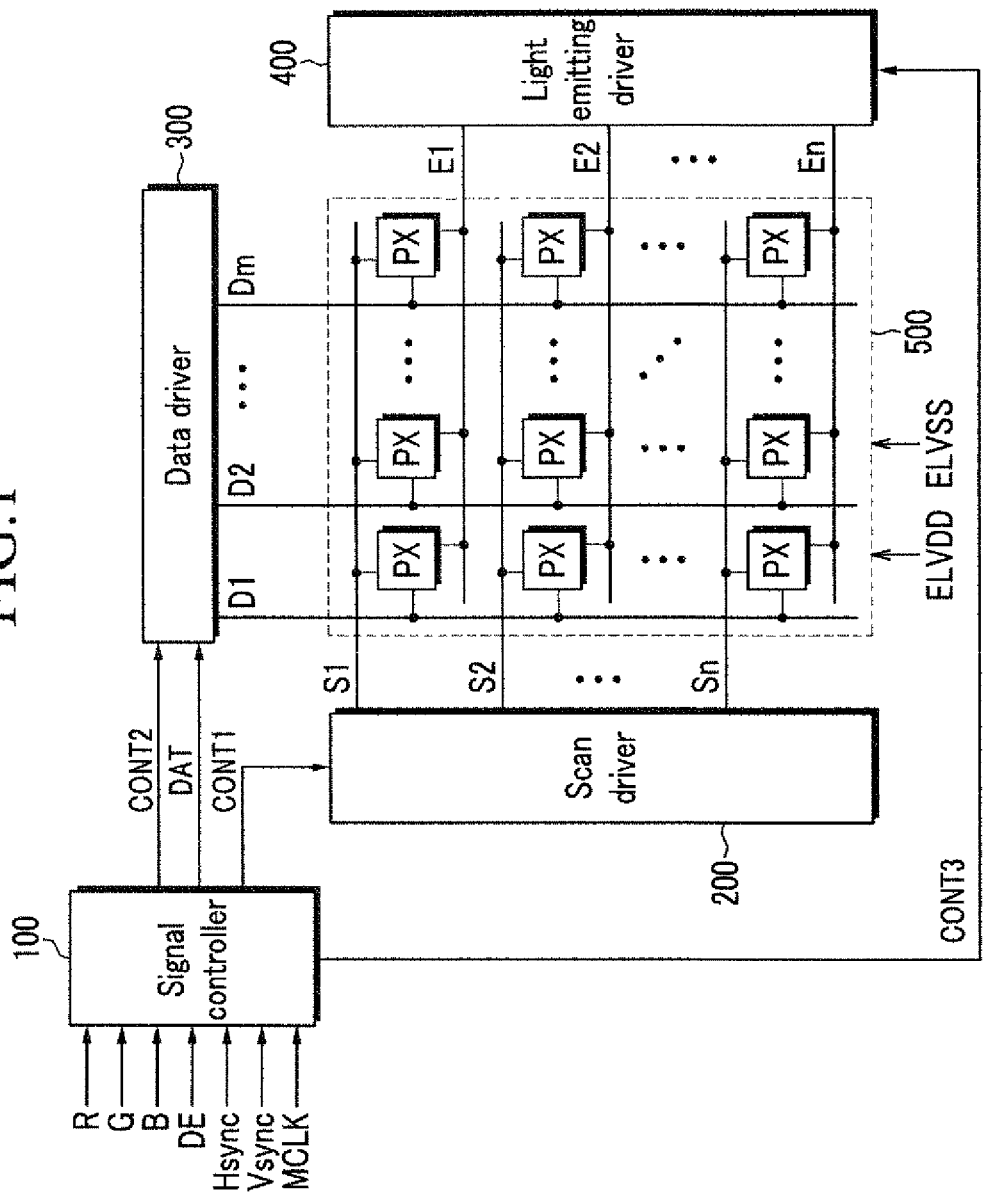
FIG. 1 is a block diagram of an organic light emitting diode (OLED) display according to an exemplary embodiment of the present invention.

Hereinafter, exemplary embodiments of the present invention will be described in detail with reference to the accompanying drawings so that those having ordinary skill in the art to which the present invention pertains will readily appreciate the present invention. The present invention may be implemented in various different forms and is not limited to the exemplary embodiments described herein.

In describing the exemplary embodiments of the present invention, the same reference numerals are used for elements having the same constructions and representatively described in a first exemplary embodiment of the present invention, and in remaining exemplary embodiments of the present invention, only different constructions from those of the first exemplary embodiment will be described.

In order to clarify the present invention, parts that are not connected with the description will be omitted, and the same elements or equivalents are referred to by the same reference numerals throughout the specification.

Throughout this specification and the claims that follow, when it is described that an element is "coupled" to another element, the element may be "directly coupled" to the other element or "electrically coupled" to the other element through a third element. In addition, unless explicitly described to the contrary, the word "comprise" and variations such as "comprises" or "comprising" will be understood to imply the inclusion of stated elements but not the exclusion of any other elements.

Hereafter, a gate-on voltage turning on a p-channel field effect transistors is a logic low level voltage, and a gate-off voltage turning off the p-channel field effect transistors is a logic high level voltage; or a gate-on voltage turning on an n-channel field effect transistors is a logic high level voltage, and a gate-off voltage turning off the n-channel field effect transistors is a logic low level voltage.

FIG. 1 is a block diagram of an organic light emitting diode (OLED) display according to an exemplary embodiment of the present invention.

Referring to FIG. 1, the organic light emitting diode (OLED) display includes a signal controller 100, a scan driver 200, a data driver 300, a light emission driver 400, and a display unit 500.

The signal controller 100 receives a video signal R, G, B that is inputted from an external device, and an input control signal that controls displaying thereof. The video signal R, G, B includes luminance of each pixel PX, and the luminance has a grayscale having a predetermined number, for example, $1024=2^{10}$, $256=2^8$, or $64=2^6$. As examples of the input control signal, there are a vertical synchronization signal Vsync, a horizontal synchronization signal Hsync, a main clock signal MCLK, and a data enable signal DE.

The signal controller 100 appropriately process the input video signal R, G, B according to the operation condition of the display unit 500 and the data driver 300 on the basis of the input video signal R, G, B and the input control signal, and generates a scan control signal CONT1, a data control signal CONT2, an image data signal DAT, and a light emission control signal CONT3. The signal controller 100 transmits the scan control signal CONT1 to the scan driver 200. The signal controller 100 transmits the data control signal CONT2 and image data signal DAT to the data driver 300. The signal controller 100 transmits the light emission control signal CONT3 to the light emission driver 400.

The display unit 500 includes a plurality of scan lines S1-Sn, a plurality of data lines D1-Dm, a plurality of light emitting lines E1-En, and a plurality of pixels PX, connected to a plurality of signal lines S1-Sn, D1-Dm and E1-En, arranged in an approximate matrix form.

The plurality of scan lines S1-Sn are extended in a row direction and are in parallel with each other. The plurality of data lines D1-Dm are extended in a column direction and are in parallel with each other. The plurality of light emitting lines E1-En respectively corresponding to the scan lines S1-Sn are extended in a row direction and are in parallel with each other. A plurality of pixels PX of the display 500 receive a first power source voltage ELVDD and a second power source voltage ELVSS from the outside.

The scan driver 200 is connected to the plurality of scan lines S1-Sn, and applies scan signals, that include either a gate-on voltage that turns on a switching transistor (referring to M1 of FIG. 2) or a gate-off voltage that turns the switching transistor off, to the plurality of scan lines S1-Sn according to the scan control signal CONT1. The scan driver 200 applies scan signals to the plurality of scan lines S1-Sn such that data signals are applied to the plurality of pixels PX.

Figure 3:
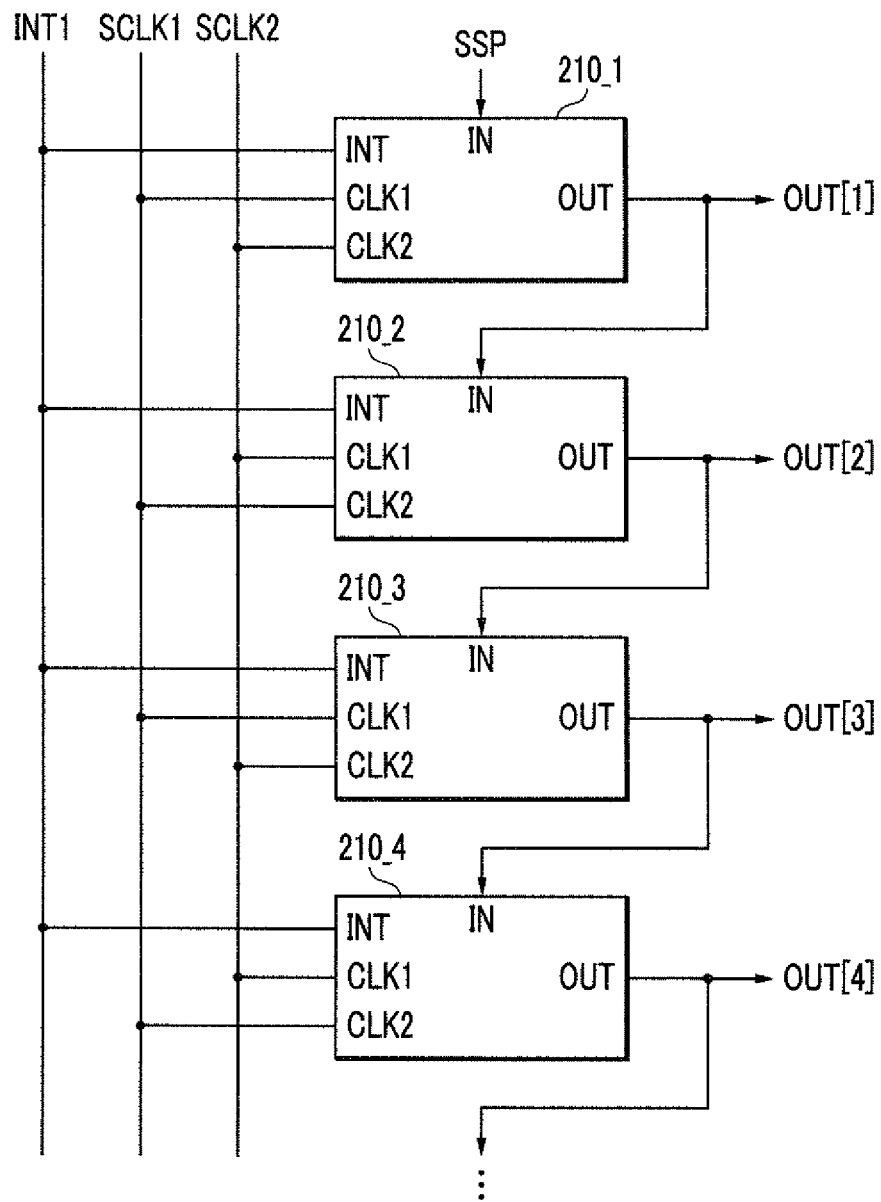
FIG. 3 is a block diagram showing a configuration of a scan driver according to an exemplary embodiment of the present invention.

The scan control signal CONT1 includes, as shown in FIG. 3, a scan start signal SSP and a plurality of clock signals INT1, SCLK1, and SCLK2. The scan start signal SSP is a signal for generating the first scan signal for displaying the image of one frame. The plurality of clock signals are synchronization signals for generating the scan signals to the plurality of scan lines S1-Sn.

The scan driver 200 sequentially transmits the scan signals to the plurality of scan lines S-Sn according to the signals SSP, INT1, SCLK1, and SCLK2 included in the scan control signal CONT1.

The data driver 300 is connected to a plurality of data lines D1-Dm, and selects a data voltage according to the image data signal DAT. The data driver 300 applies the selected data voltage as the data signal to a plurality of data lines D1-Dm according to the data control signal CONT2.

The light emission driver 400 is connected to a plurality of light emitting lines E1-En, and applies light emitting signals, that include either a gate-on voltage that turns on a switching transistor (referring to M3 of FIG. 2) or a gate-off voltage that turns the switching transistor off, to the plurality of light emitting lines E1-En according to the light emission control signal CONT3.

The light emission control signal CONT3 includes frame start signals FLMUP and FLMDN, a plurality of clock signals SCLK1, and SCLK2, and an entire signal ES. The frame start signals FLMUP and FLMDN are signals generating the first light emitting signal for displaying the image of one frame. The plurality of clock signals are synchronization signals for generating the light emitting signals on the light emitting lines E1-En.

The organic light emitting diode (OLED) display according to the present invention may be driven by including a scan period for applying a data signal to the plurality of pixels PX included in the display unit 500, and a sustain period for emitting the pixels PX. The light emission driver 400 applies the gate-off voltage to the plurality of light emitting lines E1-En during the scan period, and the gate-on voltage to the plurality of light emitting lines E1-En during the sustain period.

Figure 2:
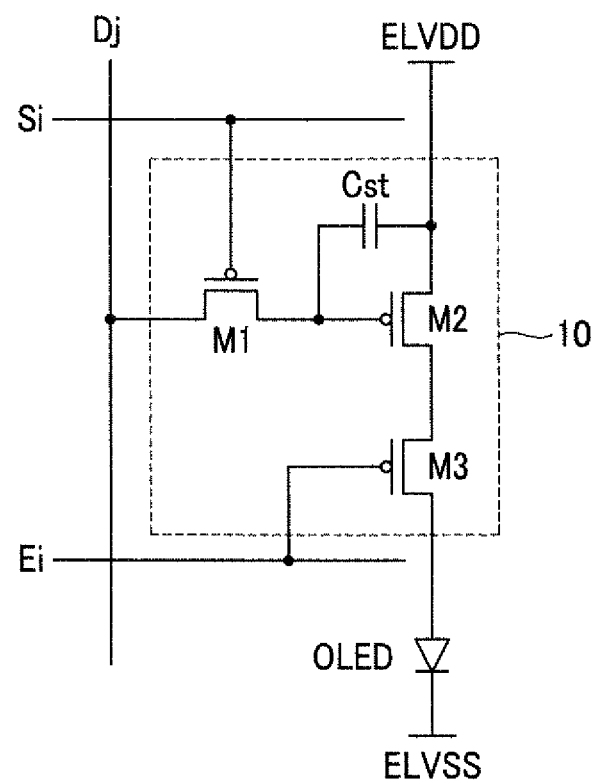
FIG. 2 is a circuit diagram of a pixel according to an exemplary embodiment of the present invention.

FIG. 2 is a circuit diagram showing a pixel according to an exemplary embodiment of the present invention.

Referring to FIG. 2, the pixel PX of the organic light emitting diode (OLED) display includes the organic light emitting diode OLED and a pixel circuit 10 to control the organic light emitting diode OLED. The pixel circuit 10 includes a switching transistor M1, a driving transistor M2, a light emitting transistor M3, and a storage capacitor Cst.

The switching transistor M1 includes a gate electrode connected to the scan line Si, one terminal connected to the data line Dj, and the other terminal connected to the gate electrode of the driving transistor M2.

The driving transistor M2 includes a gate electrode connected to the other terminal of the switching transistor M1, one terminal connected to the ELVDD power source, and the other terminal connected to one terminal of the light emitting transistor M3.

The light emitting transistor M3 includes a gate electrode connected to the light emitting line Ei, one terminal connected to the other terminal of the driving transistor M2, and the other terminal connected to the anode of the organic light emitting diode OLED.

The storage capacitor Cst includes one terminal connected to the gate electrode of the driving transistor M1 and the other terminal connected to the ELVDD power source. The storage capacitor Cst charges the data voltage applied to the gate electrode of the driving transistor M2, and it is maintained after the switching transistor M1 is turned off.

The organic light emitting diode OLED includes an anode connected to the other terminal of the light emitting transistor M3 and a cathode connected to the ELVSS power source.

The switching transistor M1, the driving transistor M2, and the light emitting transistor M3 may be p-channel field effect transistors. Here, the gate-on voltage turning on the switching transistor M1, the driving transistor M2, and the light emitting transistor M3 is a logic low level voltage, and the gate-off voltage turning off is a logic high level voltage.

Here, they are the p-channel field effect transistors, however at least one of the switching transistor M1, the driving transistor M2, and the light emitting transistor M3 may be an n-channel field effect transistor, and the gate-on voltage for turning on the n-channel electric field effect transistor is the logic high voltage, and the gate-off voltage for turning it off is the logic low voltage.

When the gate-on voltage is applied to the scan line Si, the switching transistor M1 is turned on, and a data signal applied to the data line Dj is applied to one terminal of the storage capacitor Cst through the turned-on switching transistor M1 to charge the storage capacitor Cst. The driving transistor M2 controls the amount of current flowing from the ELVDD power source to the organic light emitting diode OLED corresponding to a voltage value charged in the storage capacitor Cst. When the gate-on voltage is applied to the light emitting line Ei, the light emitting transistor M3 is turned on, and the current flowing from the ELVDD power source to the driving transistor M2 flows to the organic light emitting diode OLED. The organic light emitting diode OLED generates light corresponding to the amount of current flowing through the driving transistor M2.

The organic light emitting diode OLED may emit light of one of primary colors. The primary colors include, for example, three primary colors of red, green, and blue, and a desired color is displayed with a spatial or temporal sum of the three primary colors. In this case, the organic light emitting diode OLED may partially emit white light, and accordingly luminance is increased. Alternatively, the organic light emitting diode OLED of all pixels PX may emit white light, and some of the pixels PX may further include a color filter (not shown) that changes white light emitted from the organic light emitting diode OLED to light of one of the primary colors.

Each driving device 100, 200, 300, and 400 may be directly mounted on the display unit 500 in the form of at least one integrated circuit chip, mounted on a flexible printed circuit film, attached to the display unit 500 in the form of a tape carrier package (TCP), or mounted on a separate printed circuit board (PCB). Alternatively, they may be integrated in the display unit together with the signal lines S1-Sn. D1-Dm, and E1-En.

FIG. 3 is a block diagram showing a configuration of a scan driver according to an exemplary embodiment of the present invention.

Referring to FIG. 3, the scan driver includes a plurality of scan driving blocks 210_1, 210_2, 210_3, 210_4, . . . generating a plurality of scan signals. Each of the scan driving blocks 210_1, 210_2, 210_3, 210_4, . . . receives a plurality of input signals to generate the output signals OUT[1], OUT[2], OUT[3], OUT[4], . . . transmitted to the plurality of scan lines S1-Sn.

The input signals of each of the scan driving blocks 210_1, 210_2, 210_3, 210_4, . . . include an initial signal INT1, the first clock signal SCLK1, the second clock signal SCLK2, and the scan start signal SSP or the output signal of the adjacent scan driving block.

Each of the scan driving blocks 210_1, 210_2, 210_3, 210_4, . . . includes an initial signal input terminal INT, the first clock signal input terminal CLK1, the second clock signal input terminal CLK2, a sequence input terminal IN input with the scan start signal SSP or the output signal of the adjacent scan driving block, and a signal output terminal OUT.

The initial signal input terminal INT of the odd-numbered scan driving blocks 210_1, 210_3, . . . is connected to the wire of the initial signal INT1, the first clock signal input terminal CLK1 is connected to the wire of the first clock signal SCLK1, and the second clock signal input terminal CLK2 is connected to the wire of the second clock signal SCLK2.

The initial signal input terminal INT of the even-numbered scan driving blocks 210_2, 210_4, . . . is connected to the wire of the initial signal INT1, the first clock signal input terminal CLK1 is connected to the wire of the second clock signal SCLK2, and the second clock signal input terminal CLK2 is connected to the wire of the first clock signal SCLK1.

The sequence input terminal IN of the first scan driving block 210_1 is applied with the scan start signal SSP, and the sequence input terminal IN of the other scan driving blocks 210_2, 210_3, 210_4, . . . is applied with the output signal of the scan driving block that is arranged previous.

Each of the scan driving blocks 210_1, 210_2, 210_3, 210_4, . . . outputs output signals OUT[1], OUT[2], OUT[3], OUT[4], . . . that are generated according to the signals input to the sequence input terminal IN, the initial signal input terminal INT, the first clock signal input terminal CLK1, and the second clock signal input terminal CLK2 to the signal output terminal OUT.

Hereafter, the output signal output by the scan driving block means the scan signal of the gate-on voltage turning on the switching transistor M1, if is not additionally mentioned.

The first scan driving block 210_1 transmits the output signal OUT[1] generated by receiving the scan start signal SSP to the first scan line S1 and the second scan driving block 210_2. The second scan driving block 210_2 transmits the output signal OUT[2] generated by receiving the output signal OUT[I] of the first scan driving block 210_1 to the second scan line S2 and the third scan driving block 210_3. As described above, the plurality of scan driving blocks 210_1, 210_2, 210_3, 210_4, . . . sequentially output the scan signal of the gate-on voltage.

Figure 4:
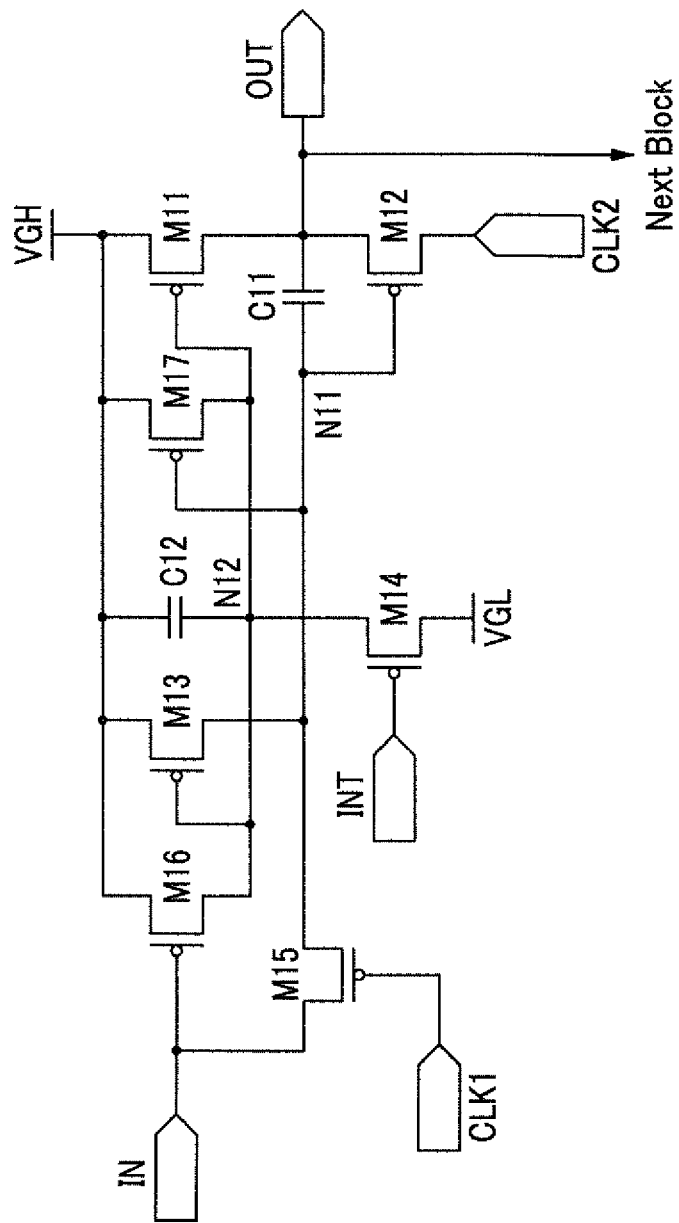
FIG. 4 is a circuit diagram of a scan driving block included in the scan driver of FIG. 3.

FIG. 4 is a circuit diagram of a scan driving block included in the scan driver of FIG. 3.

Referring to FIG. 4, the scan driving block includes a plurality of input terminals IN, INT, CLK1, and CLK2, a signal output terminal OUT, a plurality of transistors M11, M12, M13, M14, M15, M16, and M17, and a plurality of capacitors C11 and C12. The plurality of input terminals include the sequence input terminal IN, the initial signal input terminal INT, the first clock signal input terminal CLK1, and the second clock signal input terminal CLK2.

Transistor M11 includes a gate electrode connected to second node N12, one terminal connected to a VGH power source, and the other terminal connected to signal output terminal OUT.

Transistor M12 includes a gate electrode connected to first node N11, one terminal connected to second clock signal input terminal CLK2, and the other terminal connected to signal output terminal OUT.

Transistor M13 includes a gate electrode connected to second node N12, one terminal connected to the VGH power source, and the other terminal connected to first node N11.

Transistor M14 includes a gate electrode connected to initial signal input terminal INT, one terminal connected to a VGL power source, and the other terminal connected to second node N12.

Transistor M15 includes a gate electrode connected to first clock signal input terminal CLK1, one terminal connected to sequence input terminal IN, and the other terminal connected to first node N11.

Transistor M16 includes a gate electrode connected to sequence input terminal IN, one terminal connected to the VGH power source, and the other terminal connected to second node N12.

Transistor M17 includes a gate electrode connected to first node N11, one terminal connected to the VGH power source, and the other terminal connected to second node N12.

Capacitor C11 includes one terminal connected to first node N11 and the other terminal connected to signal output terminal OUT.

Capacitor C12 includes one terminal connected to the VGH power source and the other terminal connected to second node N12.

The VGH power source is the power source having the voltage of the logic high level, and the VGL power source is the power source having the voltage of the logic low level.

The plurality of transistors M11, M12, M13, M14, M15, M16, and M17 are p-channel field effect transistors. The gate-on voltage turning on the plurality of transistors M1, M12, M13, M14, M15, M16, and M17 is the voltage of the logic low level and the gate-off voltage turning them off is the voltage of the logic high level. At least one of the plurality of transistors M11, M12, M13, M14, M15, M16, and M17 may be an n-channel field effect transistor, and here, the gate-on voltage turning on the n-channel field effect transistor is the voltage of the logic high level and the gate-off voltage turning it off is the voltage of the logic low level.

Figure 5:
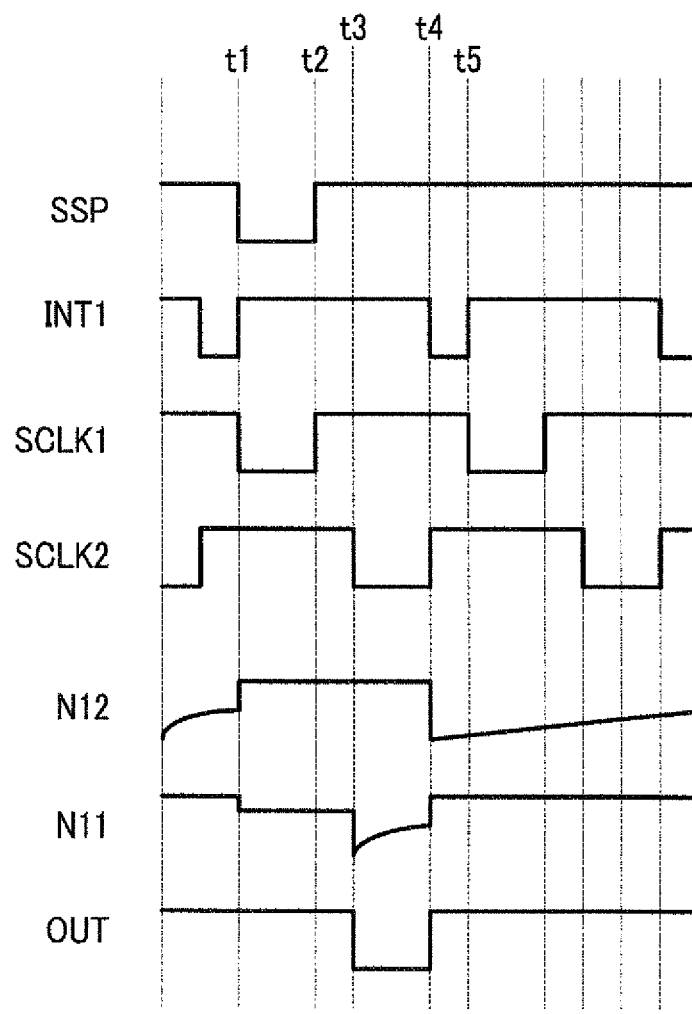
FIG. 5 is a timing diagram explaining a driving method of the scan driver of FIG. 3.

FIG. 5 is a timing diagram explaining a driving method of the scan driver of FIG. 3.

Referring to FIG. 3 to 5, in the time period t1-t2, the scan start signal SSP is applied to the sequence input terminal IN of the first scan driving block 210_1 as a voltage of the logic low level. Here, the initial signal INT1 as a voltage of the logic high level, the first clock signal SCLK1 as a voltage of the logic low level, and the second clock signal SCLK2 as a voltage of the logic high level are applied. In the first scan driving block 210_1, the initial signal INT1 is applied to the initial signal input terminal INT, the first clock signal SCLK1 is applied to the first clock signal input terminal CLK1, and the second clock signal SCLK2 is applied to the second clock signal input terminal CLK2. The voltage of the logic low level is applied to the gate electrode such that the transistor M15 and the transistor M16 are turned on. The VGH power source voltage is transmitted to the second node N12 through the turned-on transistor M16 and the second node N12 forms the voltage of the logic high level. The transistor M11 having the gate electrode connected to the second node N12 is turned off. The scan start signal SSP of the logic low level is transmitted to the first node N11 through the turned-on transistor M15. The transistor M12 having the gate electrode connected to the first node N11 is turned on, and the second clock signal SCLK2 of the logic high level is transmitted to the signal output terminal OUT through the turned-on transistor M12. Here, one terminal of the capacitor C11 is applied with the voltage of the logic low level and the other terminal thereof is applied with the voltage of the logic high level for the charge.

To prevent a short circuit current flowing from the VGH power source to the VGL power source, the scan start signal SSP and the first clock signal SCLK1 are changed into the voltage of the logic high level at the time t2, and the second clock signal SCLK2 is changed into the voltage of the logic low level at the time t3.

In the time period t3-t4, the scan start signal SSP, the initial signal INT1, and the first clock signal SCLK1 are applied as the voltage of the logic high level, and the second clock signal SCLK2 is applied as the voltage of the logic low level. In the first scan driving block 210_1, the transistor M14, the transistor M15, and the transistor M16 to which the voltage of the logic high level is applied to the gate electrodes are turned off. Here, the voltage of the first node N11 forms the voltage of the logic low level by the voltage charged to the capacitor C11. The transistor M12 and the transistor M17 having the gate electrode connected to the first node N11 are turned on. The second clock signal SCLK2 of the logic low level is transmitted to the signal output terminal OUT through the turned-on transistor M12. That is, the first scan driving block 210_1 outputs of the scan signal of the logic low level.

When the output signal OUT[1] of the logic low level is output to the output signal output terminal OUT, it is in a state in which one terminal of the transistor M11 is applied with the VGH power source voltage and the other terminal thereof is applied with the voltage of the logic low level. The leakage current may flow by the voltage difference between one terminal and the other terminal of the transistor M11. The level of the output signal OUT[1] of the signal output terminal OUT is not constantly maintained with the voltage of the logic low level during the time period t3-t4, and may be slowly increased by the leakage current flowing in the transistor M11. Particularly, in the process of compensating the characteristic deviation of the driving transistor and the resistance deviation of the organic light emitting diode OLED of the pixel, if the time period outputting the scan signal of the logic low level output is increased, the change of the voltage of the scan signal may be further increased by the leakage current.

In the present invention, the transistor M17 is turned on during the time that the voltage of the logic low level is transmitted to the signal output terminal OUT such that the flow of the leakage current to the transistor M11 is prevented. In the time period t3-t4, the voltage of the logic low level formed at the first node N11 is transmitted to the gate electrode of the transistor M17 such that the transistor M17 is turned on. The VGH power source voltage is transmitted to the gate electrode of the transistor M11 through the turned-on transistor M17. The VGH power source voltage is applied to the gate electrode and one terminal of the transistor M11 such that the transistor M11 maintains the turned-off state. Accordingly, leakage current flowing to the transistor M11 may be prevented, and the level of the scan signal output from the signal output terminal OUT may be constantly maintained.

In the time period t4-t5, the initial signal INT1 is applied as the voltage of the logic low level, and the first clock signal SCLK1 and the second clock signal SCLK2 are applied as the voltage of the logic high level. The transistor M14 having the gate electrode applied with the voltage of the logic low level is turned on. The VGL power source voltage is transmitted to the second node N12 through the turned-on transistor M14. The transistor M13 and the transistor M11 having the gate electrode connected to the second node N12 are turned on. The VGH power source voltage is transmitted to the first node N11, and the transistor M12 is turned off through the turned-on transistor M13. The VGH power source voltage is transmitted to the signal output terminal OUT and is output through the turned-on transistor M11.

Like the first scan driving block 210_1, the other scan driving blocks 210_2, 210_3, 210_4, . . . sequentially output the scan signal of the logic low level.

Figure 6:
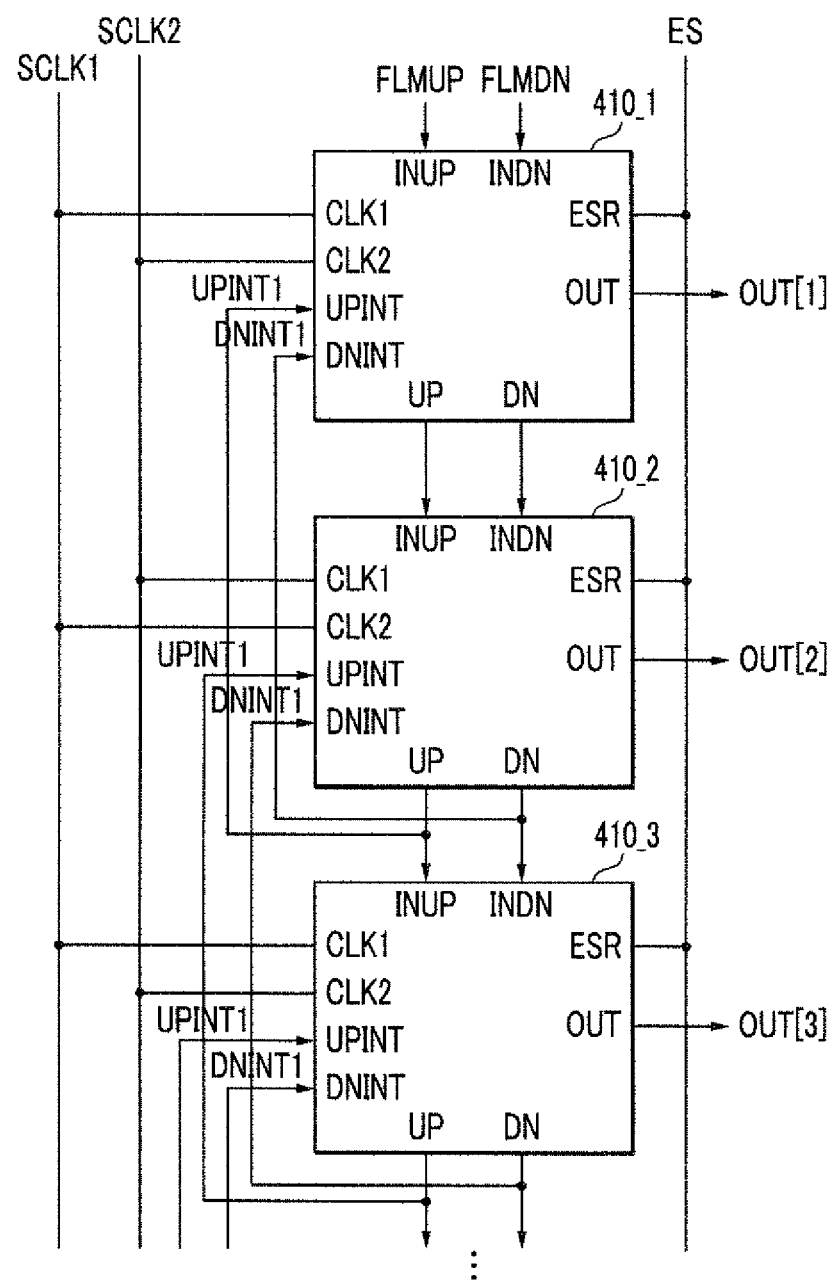
FIG. 6 is a block diagram of a configuration of a light emitting driver according to an exemplary embodiment of the present invention.

FIG. 6 is a block diagram of a configuration of a light emitting driver according to an exemplary embodiment of the present invention.

Referring to FIG. 6, the light emitting driver includes a plurality of light emitting driving blocks 410_1, 410_2, 410_3, . . . . Each of the light emitting driving block 410_1, 410_2, 410_3, . . . receives a plurality of input signals to generate the output signals OUT[1], OUT[2], OUT[3], . . . .

The input signals include the first clock signal SCLK1, the second clock signal SCLK2, the first initial signal UPINT1, the second initial signal DNINT1, the first frame start signal FLMUP, the second frame start signal FLMDN, and the entire signal ES.

Each of the light emitting driving blocks 410_1, 410_2, 410_3, . . . includes first sequence input terminal INUP, second sequence input terminal INDN, first clock signal input terminal CLK1, second clock signal input terminal CLK2, first initial signal input terminal UPINT, second initial signal input terminal DNINT, entire signal input terminal ESR, first sequence output terminal UP, second sequence output terminal DN, and signal output terminal OUT.

The first clock signal SCLK1 and the second clock signal SCLK2 are input to the first clock signal input terminal CLK1 and the second clock signal input terminal CLK2. The first clock signal input terminal CLK1 of the odd-numbered light emitting driving blocks 410_1, 410_3, . . . is connected to the wire of the first clock signal SCLK1, and the second clock signal input terminal CLK2 is connected to the wire of the second clock signal SCLK2. The first clock signal input terminal CLK1 of the even-numbered light emitting driving blocks 410_2, . . . is connected to the wire of the second clock signal SCLK2, and the second clock signal input terminal CLK2 is connected to the wire of the first clock signal SCLK1.

The first sequence input terminal INUP is input with the first frame start signal FLMUP or the output signal of the first sequence output terminal UP of a previous arranged and adjacent light emitting driving block. The second sequence input terminal INDN is input with the second frame start signal FLMDN or the output signal of the second sequence output terminal DN of the previous arranged and adjacent light emitting driving block. The first frame start signal FLMUP is applied to the first sequence input terminal INUP of the first light emitting driving block 410_1, and the second frame start signal FLMDN is applied to the second sequence input terminal INDN. The first sequence input terminal INUP of the other light emitting driving blocks 410_2, 410_3, . . . is applied with the output signal of the first sequence output terminal UP of the previous arranged light emitting driving block, and the second sequence input terminal INDN is applied with the output signal of the second sequence output terminal DN of the previous arranged light emitting driving block.

The first initial signal input terminal UPINT is applied with the output signal of the first sequence output terminal UP of the next arranged light emitting driving block, and the second initial signal input terminal DNINT is applied with the output signal of the second sequence output terminal DN of the next arranged light emitting driving block. The entire signal input terminal ESR is applied with the entire signal ES.

Each of the light emitting driving blocks 410_1, 410_2, 410_3, . . . outputs to the signal output terminal OUT the output signals OUT[1], OUT[2], OUT[3], . . . that are generated according to the signals input to the first sequence input terminal INUP, the second sequence input terminal INDN, the first clock signal input terminal CLK1, the second clock signal input terminal CLK2, the first initial signal input terminal UPINT, and the second initial signal input terminal DNINT.

Figure 7:
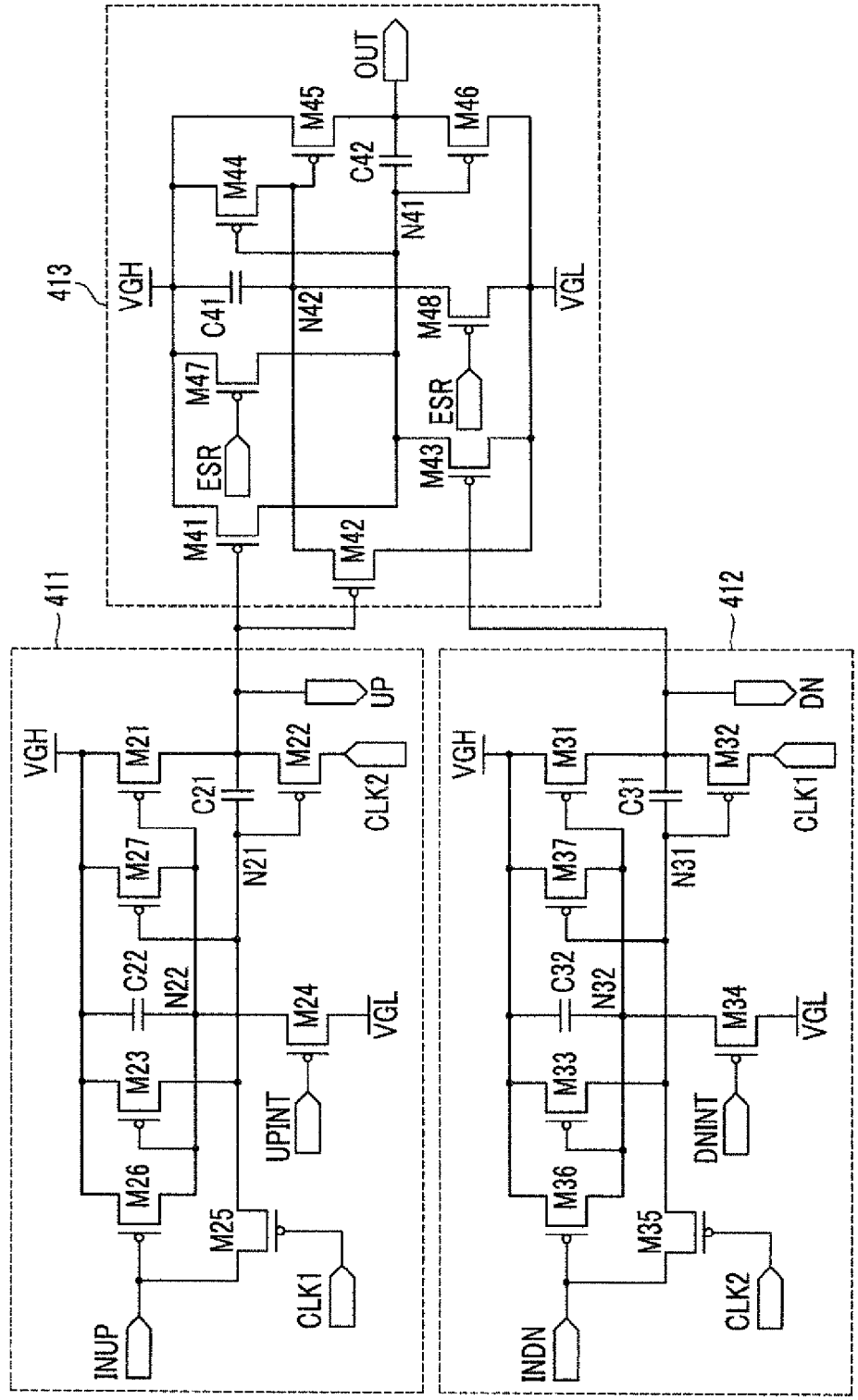
FIG. 7 is a circuit diagram of a light emitting driving block included in the light emitting driver of FIG. 6.

FIG. 7 is a circuit diagram of a light emitting driving block included in the light emitting driver of FIG. 6.

Referring to FIG. 7, the light emitting driving block includes a first input block 411, a second input block 412, and an output block 413. First input block 411 includes first sequence input terminal INUP, first clock signal input terminal CLK1, second clock signal input terminal CLK2, first initial signal input terminal UPINT, first sequence output terminal UP, a plurality of transistors M21, M22, M23, M24, M25, M26, and M27, a plurality of capacitors C21 and C22, and a plurality of nodes N21 and N22.

Second input block 412 includes second sequence input terminal INDN, first clock signal input terminal CLK1, second clock signal input terminal CLK2, second initial signal input terminal DNINT, second sequence output terminal DN, a plurality of transistors M31, M32, M33, M34, M35, M36, and M37, a plurality of capacitors C31 and C32, and a plurality of nodes N31 and N32.

Output block 413 includes entire signal input terminal ESR, signal output terminal OUT, a plurality of transistors M41, M42, M43, M44, M45, M46, M47, and M48, a plurality of capacitors C41 and C42, and a plurality of nodes N41 and N42.

In the first input block 411, transistor M21 includes a gate electrode connected to second node N22, one terminal connected to the VGH power source, and the other terminal connected to first sequence output terminal UP.

Transistor M22 includes a gate electrode connected to first node N21, one terminal connected to second clock signal input terminal CLK2, and the other terminal connected to first sequence output terminal UP.

Transistor M23 includes a gate electrode connected to second node N22, one terminal connected to the VGH power source, and the other terminal connected to first node N21.

Transistor M24 includes a gate electrode connected to first initial signal input terminal UPINT, one terminal connected to the VGL power source, and the other terminal connected to second node N22.

Transistor M25 includes a gate electrode connected to first clock signal input terminal CLK1, one terminal connected to first sequence input terminal INUP, and the other terminal connected to first node N21.

Transistor M26 includes a gate electrode connected to first sequence input terminal INUP, one terminal connected to the VGH power source, and the other terminal connected to second node N22.

Transistor M27 includes a gate electrode connected to first node N21, one terminal connected to the VGH power source, and the other terminal connected to second node N22.

Capacitor C21 includes one terminal connected to first node N21 and the other terminal connected to first sequence output terminal UP.

Capacitor C21 includes one terminal connected to the VGH power source and the other terminal connected to second node N22.

In the second input block 412, transistor M31 includes a gate electrode connected to second node N32, one terminal connected to the VGH power source, and the other terminal connected to second sequence output terminal DN.

Transistor M32 includes a gate electrode connected to first node N31, one terminal connected to first clock signal input terminal CLK1, and the other terminal connected to second sequence output terminal DN.

Transistor M33 includes a gate electrode connected to second node N32, one terminal connected to the VGH power source, and the other terminal connected to first node N31.

Transistor M34 includes a gate electrode connected to second initial signal input terminal DNINT, one terminal connected to the VGL power source, and the other terminal connected to second node N32.

Transistor M35 includes a gate electrode connected to the second clock signal input terminal CLK2, one terminal connected to second sequence input terminal INDN, and the other terminal connected to first node N31.

Transistor M36 includes a gate electrode connected to second sequence input terminal INDN, one terminal connected to the VGH power source, and the other terminal connected to second node N32.

Transistor M37 includes a gate electrode connected to first node N31, one terminal connected to the VGH power source, and the other terminal connected to second node N32.

Capacitor C31 includes one terminal connected to first node N31 and the other terminal connected to second sequence output terminal DN.

Capacitor C31 includes one terminal connected to the VGH power source and the other terminal connected to second node N32.

In the output block 413, transistor M41 includes a gate electrode connected to first sequence output terminal UP, one terminal connected to the VGH power source, and the other terminal connected to first node N41.

Transistor M42 includes a gate electrode connected to first sequence output terminal UP, one terminal connected to the VGL power source, and the other terminal connected to second node N42.

Transistor M43 includes a gate electrode connected to second sequence output terminal DN, one terminal connected to the VGL power source, and the other terminal connected to first node N41.

Transistor M44 includes a gate electrode connected to first node N41, one terminal connected to the VGH power source, and the other terminal connected to second node N42.

Transistor M45 includes a gate electrode connected to second node N42, one terminal connected to the VGH power source, and the other terminal connected to signal output terminal OUT.

Transistor M46 includes a gate electrode connected to first node N41, one terminal connected to the VGL power source, and the other terminal connected to signal output terminal OUT.

Transistor M47 includes a gate electrode connected to the entire signal input terminal ESR, one terminal connected to the VGH power source, and the other terminal connected to first node N41.

Eighth transistor M48 includes a gate electrode connected to the entire signal input terminal ESR, one terminal connected to the VGL power source, and the other terminal connected to second node N42.

The capacitor C41 includes one terminal connected to the VGH power source and the other terminal connected to the second node N42.

The capacitor C42 includes one terminal connected to the first node N41 and the other terminal connected to the signal output terminal OUT.

The plurality of transistors M21, M22, M23, M24, M25, M26, M27, M31, M32, M33, M34, M35, M36, M37, M41, M42, M43, M44, M45, M46, M47, and M48 are p-channel field effect transistors. The gate-on voltage turning on the plurality of transistors M21, M22, M23, M24, M25, M26, M27, M31, M32, M33, M34, M35, M36, M37, M41, M42, M43, M44, M45, M46, M47, and M48 is the voltage of the logic low level, and the gate-off voltage turning them off is the voltage of the logic high level. At least one of the plurality of transistors M21, M22, M23, M24, M25, M26, M27, M31, M32, M33, M34, M35, M36, M37, M41, M42, M43, M44, M45, M46, M47, and M48 may be an n-channel field effect transistor, and here, the gate-on voltage turning on the n-channel field effect transistor is the voltage of the logic high level and the gate-off voltage turning it off is the voltage of the logic low level.

Figure 8:
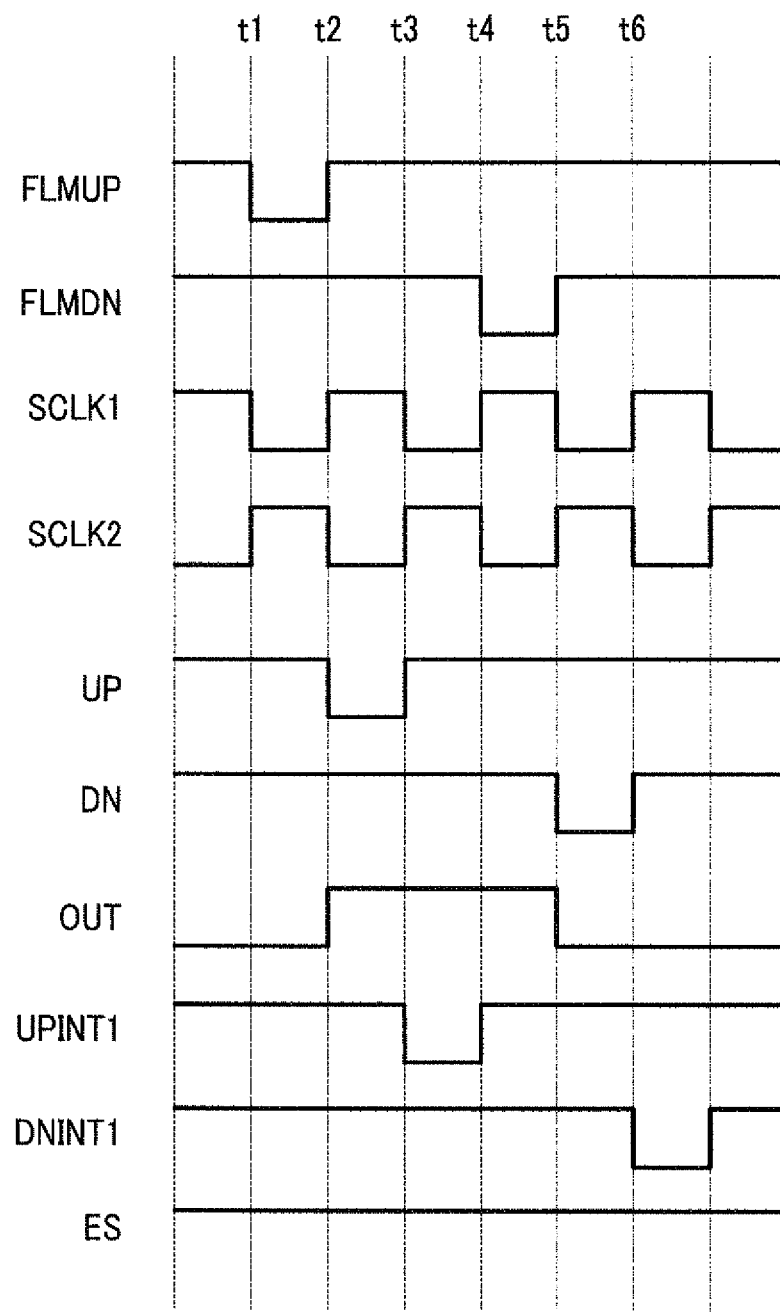
FIG. 8 is a timing diagram explaining a driving method of the light emitting driver of FIG. 6.

FIG. 8 is a timing diagram to explain the driving method of the light emitting driver of FIG. 6. It explains that the light emitting driver outputs an output signal according to signals transmitted from the first input block 411 and the second input block 412 when the entire signal ES is applied with the gate-off voltage.

Referring to FIGS. 6 to 8, the first frame start signal FLMUP is applied as the voltage of the logic low level at the time period t1-t2, and the second frame start signal FLMDN is applied as the voltage of the logic low level at the time period t4-t5.

In the time period t1-t2, the first sequence input terminal INUP of the first light emitting driving block 410_1 is input with the first frame start signal FLMUP of the logic low level, and the second sequence input terminal INDN is input with the second frame start signal FLMDN of the logic high level. Here, the first clock signal input terminal CLK1 is input with the first clock signal SCLK1 of the logic low level, and the second clock signal input terminal CLK2 is input with the second clock signal SCLK2 of the logic high level.

In the time period t1-t2, for the first input block 411 of the first light emitting driving block 410_1, the transistor M25 and the transistor M26 are turned on. The VGH power source voltage is transmitted to the second node N22 and the transistor M21 is turned off through the turned-on transistor M26. The first frame start signal FLMUP of the logic low level is transmitted to the first node N21 through the turned-on transistor M25. The voltage of the logic low level of the first node N21 turns on the transistor M22, and the second clock signal SCLK2 of the logic high level is transmitted to the first sequence output terminal UP through the turned-on transistor M22. Here, one terminal of the capacitor C21 is applied with the voltage of the logic low level and the other terminal is applied with the voltage of the logic high level thereby being charged.

In the time period t2-t3, the first sequence input terminal INUP of the first light emitting driving block 410_1 is input with the first frame start signal FLMUP of the logic high level, the second sequence input terminal INDN is input with the second frame start signal FLMDN of the logic high level, the first clock signal input terminal CLK1 is input with the first clock signal SCLK1 of the logic high level, and the second clock signal input terminal CLK2 is input with the second clock signal SCLK2 of the logic low level.

In the time period t2-t3, for the first input block 411 of the first light emitting driving block 410_1, the transistor M25 and the transistor M26 are turned off. Here, the voltage of the logic low level is formed at the first node N21 by the charged voltage of the capacitor C21. The transistor M22 and the transistor M27 are turned on by the voltage of the logic low level formed at the first node N21. The second clock signal SCLK2 of the logic low level is transmitted to the first sequence output terminal UP through the turned-on transistor M22. That is, the signal of the logic low level is output to the first sequence output terminal UP.

In the time period t2-t3, for the output block 413 of the first light emitting driving block 410_1, the voltage of the logic low level transmitted to the first sequence output terminal UP turns on the transistor M41 and the transistor M42. The VGH power source voltage is transmitted to the first node N41 through the turned-on transistor M41, and the power source voltage VGL is transmitted to the second node N42 through the turned-on transistor M42. The voltage of the logic high level of the first node N41 turns off the transistor M44. The voltage of the logic low level of the second node N42 turns on the transistor M45, and the VGH power source voltage is transmitted and output to the signal output terminal OUT through the turned-on transistor M45. Here, one terminal of the capacitor C41 is applied with the VGH power source voltage and the other terminal is applied with the VGL power source voltage thereby being charged. As described above, the first light emitting driving block 410_1 outputs the output signal OUT[1] of the logic high level in the time period t2-t3.

Meanwhile, in the time period t2-t3, the first sequence input terminal INUP of the second light emitting driving block 410_2 is applied with the voltage of the logic low level output from the first sequence output terminal UP of the first light emitting driving block 4101, the first clock signal input terminal CLK1 is applied with the second clock signal SCLK2 of the logic high level, and the second clock signal input terminal CLK2 is applied with the first clock signal SCLK1 of the logic low level. Accordingly, the second light emitting driving block 410_2 in the time period t2-t3 receives the signal having the same waveform as the signal input to the first light emitting driving block 410_1 in the time period t1-t2, and is equally operated.

Also, the second light emitting driving block 410_2 in the time period t3-t4 receives the signal having the same waveform as the signal input to the first light emitting driving block 410_1 in the time period t2-t3, and is equally operated. The second light emitting driving block 410_2 outputs the output signal of the logic low level to the first sequence output terminal UP in the time period t3-t4. That is, the second light emitting driving block 410_2 is delayed by one horizontal cycle for the first light emitting driving block 410_1 and is operated. That is, the k-th light emitting driving block is delayed by one horizontal cycle for the k−1-th light emitting driving block and is operated.

In the time period t3-t4, the first sequence input terminal INUP of the first light emitting driving block 410_1 is input with the first frame start signal FLMUP of the logic high level, the second sequence input terminal INDN is input with the second frame start signal FLMDN of the logic high level, the first clock signal input terminal CLK1 is input with the first clock signal SCLK1 of the logic low level, and the second clock signal input terminal CLK2 is input with the second clock signal SCLK2 of the logic high level. Also, the first initial signal input terminal UPINT is input with the signal of the logic low level output from the first sequence output terminal UP of the second light emitting driving block 410_2.

In the time period t3-t4, for the first input block 411 of the first light emitting driving block 410_1, the transistor M26 is turned off, and the transistor M25 and the transistor M24 are turned on. The first frame start signal FLMUP of the logic high level is transmitted to the first node N21 through turned-on transistor M25 such that the transistor M22 is turned off. The VGL power source voltage is transmitted to the second node N22 through the turned-on transistor M24. The transistor M21 and the transistor M23 are turned on by the voltage of the logic low level formed at the second node N22. The VGH power source voltage is transmitted to the first node N21 through the turned-on transistor M23. The VGH power source voltage is transmitted to the first sequence output terminal UP through the turned-on transistor M21.

In the time period t3-t4, for the output block 413 of the first light emitting driving block 410_1, the transistor M41 and the transistor M42 are turned off. Here, the voltage of the logic low level of the second node N42 formed by the voltage charged to the capacitor C41 turns on the transistor M45, and the VGH power source voltage is transmitted to the signal output terminal OUT through the turned-on transistor M45. That is, the first light emitting driving block 410_1 outputs the output signal OUT[1] of the logic high level in the time period t3-t4.

In the time period t4-t5, the second frame start signal FLMDN is applied as the voltage of the logic low level. The first sequence input terminal INUP of the first light emitting driving block 410_1 is applied with the first frame start signal FLMUP of the logic high level, the second sequence input terminal INDN is applied with the second frame start signal FLMDN of the logic low level, the first clock signal input terminal CLK1 is applied with the first clock signal SCLK1 of the logic high level, and the second clock signal input terminal CLK2 is applied with the second clock signal SCLK2 of the logic low level.

In the time period t4-t5, for the second input block 412 of the first light emitting driving block 410_1, the transistor M35 and the transistor M26 are turned on. The VGH power source voltage is transmitted to the second node N32 through the turned-on transistor M36, and the second frame start signal FLMDN of the logic low level is transmitted to the first node N31 through the turned-on transistor M35. The transistor M32 is turned on by the voltage of the logic low level of the first node N31, and the first clock signal SCLK1 of the logic high level is transmitted to the second sequence output terminal DN through the turned-on transistor M32. Here, one terminal of the capacitor C31 is applied with the voltage of the logic low level and the other terminal thereof is the voltage of the logic high level thereby being charged.

In the time period t4-t5, the output block 413 of the first light emitting driving block 410_1 transmits the VGH power source voltage to the signal output terminal OUT through the turned-on transistor M45 by the voltage charged to the capacitor C41.

In the time period t5-t6, the first sequence input terminal INUP of the first light emitting driving block 410_1 is input with the first frame start signal FLMUP of the logic high level, the second sequence input terminal INDN is input with the second frame start signal FLMDN of the logic high level, the first clock signal input terminal CLK is input with the first clock signal SCLK1 of the logic low level, and the second clock signal input terminal CLK2 is input with the second clock signal SCLK2 of the logic high level.

In the time period t5-t6, the first input block 411 of the first light emitting driving block 410_1 transmits the second clock signal SCLK2 of the logic high level to the first sequence output terminal UP, like the time period t3-t4.

In the time period t5-t6, for the second input block 412 of the first light emitting driving block 410_1, the voltage of the logic low level is formed at the first node N31 by the voltage charged to the capacitor C31, and the transistor M32 and the transistor M37 are turned on by the voltage of the logic low level formed at the first node N31. The first clock signal SCLK1 of the logic low level is transmitted to the second sequence output terminal DN through the turned-on transistor M32.

In the time period t5-t6, for the output block 413 of the first light emitting driving block 410_1, the voltage of the logic high level of the first sequence output terminal UP turns off the transistor M41 and the transistor M42, and the voltage of the logic low level of the second sequence output terminal DN turns on the transistor M43. The VGL power source voltage is transmitted to the first node N41 through the turned-on transistor M43, and the voltage of the logic low level of the first node N41 turns on the transistor M46. The VGL power source voltage is transmitted to the signal output terminal OUT through the turned-on transistor M46 and is output. That is, the first light emitting driving block 410_1 outputs the output signal OUT[1] of the logic low level in the time period t5-t6.

As described above, the first light emitting driving block 410_1 outputs the output signal OUT[1] of the logic high level during time period t2-t5, and the output signal OUT[1] of the logic low level from the time t5. The other light emitting driving blocks 410_2, 410_3, ... are delayed by the time t1 from the previous arranged light emitting driving block, and sequentially output the output signal.

On the other hand, if the entire signal input terminal ESR is applied with the signal of the gate-on voltage, the transistor M47 and the eighth transistor M48 of the output block 413 are turned on. The VGH power source voltage is transmitted to the first node N41 through the turned-on transistor M47, and the VGL power source voltage is transmitted to the second node N42 through the turned-on eighth transistor M48. The transistor M46 having the gate electrode connected to the first node N41 is turned off, and the transistor M45 having the gate electrode connected to the second node N42 is turned on. The VGH power source voltage is transmitted to the signal output terminal OUT through the turned-on transistor M45. That is, if the signal of the gate-on voltage is applied to the entire signal input terminal ESR, the signal of the logic high level is output regardless of the signal transmitted from the first input block 411 and the second input block 412.

When transmitting the voltage of the logic low level to the first sequence output terminal UP in the first input block 411 (the time period t2-t3), the leakage current may flow from the transistor M21 of the first input block 411. By the leakage current flowing in the transistor M21, the level of the output signal of the first sequence output terminal UP is not constantly maintained as the voltage of the logic low level and may be slowly increased. Also, when transmitting the voltage of the logic low level to the second sequence output terminal DN in the second input block 412 (the time period t5-t6), the leakage current may flow to the transistor M31 of the second input block 412, and the level of the output signal of the second sequence output terminal DN is not constantly maintained as the voltage of the logic low level by the leakage current and may be slowly increased.

In the present invention, the transistor M27 is turned on during the time that the voltage of the logic low level is transmitted from the first input terminal 411 to the first sequence output terminal UP such that the leakage current flowing to the transistor M21 is prevented. If the transistor M27 is turned on, the VGH power source voltage is transmitted to the gate electrode of the transistor M21 such that the leakage current flowing to the transistor M21 is prevented.

Also, the transistor M37 is turned on during the time that the voltage of the logic low level is transmitted from the second input terminal 412 to the second sequence output terminal DN such that the leakage current flowing to the transistor M21 is prevented.

Accordingly, the level of the signal output from the first sequence output terminal UP and the second sequence output terminal DN may be uniformly maintained.

While exemplary embodiments of the present invention have been particularly shown and described with reference to the accompanying drawings, the specific terms used herein are used for the purpose of describing the invention and are not intended to define the meanings thereof or be limiting of the scope of the invention set forth in the claims. Therefore, those skilled in the art will understand that various modifications and equivalent other embodiments of the present invention are possible. Consequently, the true technical protective scope of the present invention must be determined based on the technical spirit of the appended claims.

What is claimed is:

1. A scan driver comprising a plurality of scan driving blocks, each of the scan driving blocks including:
   an output terminal outputting a scan signal to a scan line;
   a first transistor transmitting a voltage of a power source to the output terminal;
   a second transistor transmitting a clock signal to the output terminal; and
   a third transistor, the third transistor and the second transistor each including a gate electrode directly connected in common to a node formed with a gate-on voltage turning on the second transistor, the third transistor further including one terminal connected to the power source, and another terminal connected to a gate electrode of the first transistor,
   wherein the plurality of scan driving blocks are sequentially arranged, and the node is connected to a sequence input terminal applied with the output signal of the previous arranged scan driving block or a scan start signal, and
   wherein the second transistor includes:
      the gate electrode connected to the node;
      one terminal connected to the input terminal for the clock signal; and
      another terminal connected to the output terminal.

2. The scan driver of claim 1, wherein, when the second transistor is turned on such that the clock signal is transmitted to the output terminal, the third transistor is turned on such that the power source voltage is transmitted to the gate electrode of the first transistor to turn off the first transistor.

3. The scan driver of claim 2, wherein the power source is a power source of a logic high level, and the first transistor is a p-channel field effect transistor.

4. The scan driver of claim 3, wherein the second transistor and the third transistor are p-channel field effect transistors.

5. The scan driver of claim 3, wherein the clock signal is transmitted to the output terminal as a voltage of a logic low level.

6. The scan driver of claim 1 further comprising a capacitor including one terminal connected to the node and another terminal connected to the another terminal of the second transistor.

7. The scan driver of claim 6, wherein the capacitor is charged by the output signal of the previous arranged scan driving block or the scan start signal, and the second transistor and the third transistor are turned on by a voltage charged to the capacitor.

8. A light emitting driver, comprising:
   a first input block outputting a first sequence signal;
   a second input block outputting a second sequence signal; and
   an output block receiving the first sequence signal and the second sequence signal to output a light emitting signal;
   wherein at least one of the first input block and the second input block includes:
      an output terminal transmitting one of the first sequence signal and the second sequence signal to the output block;

a first transistor transmitting a voltage of a power source to the output terminal;

a second transistor transmitting a clock signal to the output terminal; and a third transistor, the third transistor and the second transistor each including a gate electrode directly connected in common to a first node formed with a gate-on voltage turning on the second transistor, the third transistor further including one terminal connected to the power source, and another terminal connected to a gate electrode of the first transistor.

9. The light emitting driver of claim 8, wherein, when the second transistor is turned on such that the clock signal is transmitted to the output terminal, the third transistor is turned on such that the power source voltage is transmitted to the gate electrode of the first transistor to turn off the first transistor.

10. The light emitting driver of claim 9, wherein the power source is a power source of a logic high level, and the first transistor is a p-channel field effect transistor.

11. The light emitting driver of claim 10, wherein the second transistor and the third transistor are p-channel field effect transistors.

12. The light emitting driver of claim 10, wherein the clock signal is transmitted to the output terminal as a voltage of a logic low level.

13. The light emitting driver of claim 8, wherein the second transistor includes:

the gate electrode connected to the node;

one terminal connected to the input terminal of the clock signal; and another terminal connected to the output terminal.

14. The light emitting driver of claim 13, further comprising a capacitor including one terminal connected to the node and another terminal connected to the another terminal of the second transistor.

15. The light emitting driver of claim 14, wherein the capacitor is charged by the output signal of the previous arranged scan driving block or the scan start signal, and the second transistor and the third transistor are turned on by a voltage charged to the capacitor.

* * * * *